(12) United States Patent
Takagi et al.

(10) Patent No.: US 8,188,476 B2
(45) Date of Patent: May 29, 2012

(54) ORGANIC EL DISPLAY AND METHOD OF MANUFACTURING THE SAME

(75) Inventors: Kazunari Takagi, Tokyo (JP); Kazuo Nakamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 351 days.

(21) Appl. No.: 12/604,471

(22) Filed: Oct. 23, 2009

(65) Prior Publication Data

US 2010/0102335 A1    Apr. 29, 2010

(30) Foreign Application Priority Data

Oct. 29, 2008  (JP) .................................. 2008-278233

(51) Int. Cl.
    *H01L 21/02*    (2006.01)
(52) U.S. Cl. .............. 257/59; 257/66; 257/72; 257/347; 257/356; 257/E27.111; 257/E27.121; 257/E29.275; 257/E29.279; 257/E29.293; 257/E33.053
(58) Field of Classification Search .............. 257/59, 257/66, 72, 347, 356, 361, E27.111, 121, 257/29.003, 275, 278, 279, 293, 33.053
See application file for complete search history.

(56) References Cited

U.S. PATENT DOCUMENTS

| | | | | |
|---|---|---|---|---|
| 5,729,308 A | * | 3/1998 | Yamazaki et al. | ............... 349/39 |
| 5,763,899 A | * | 6/1998 | Yamazaki et al. | ............... 257/59 |
| 6,362,507 B1 | * | 3/2002 | Ogawa et al. | ................. 257/350 |
| 6,531,713 B1 | * | 3/2003 | Yamazaki | ........................ 257/59 |
| 7,952,542 B2 | * | 5/2011 | Yamashita et al. | ............. 345/76 |
| 2008/0158137 A1 | * | 7/2008 | Yoshida | ......................... 345/102 |
| 2008/0164474 A1 | * | 7/2008 | Yamazaki et al. | ............... 257/59 |
| 2008/0246403 A1 | * | 10/2008 | Sagawa et al. | .................... 315/35 |
| 2008/0291182 A1 | * | 11/2008 | Yamashita et al. | ............ 345/204 |
| 2009/0046041 A1 | * | 2/2009 | Tanikame | ........................ 345/76 |
| 2011/0108842 A1 | * | 5/2011 | Yamazaki et al. | ............... 257/59 |
| 2011/0241001 A1 | * | 10/2011 | Omoto | ............................ 257/59 |

FOREIGN PATENT DOCUMENTS

| | | |
|---|---|---|
| JP | 2001 230086 | 8/2001 |
| JP | 2002 318556 | 10/2002 |
| JP | 2003 100457 | 4/2003 |
| JP | 2004 031335 | 1/2004 |
| JP | 2005-011810 | 1/2005 |
| JP | 2005 011810 | 1/2005 |
| JP | 2005 189304 | 7/2005 |
| JP | 2006-286493 | 10/2006 |
| JP | 2007 156058 | 6/2007 |
| JP | 2007 179914 | 7/2007 |

OTHER PUBLICATIONS

Sony Corporation; Japanese Application No. 2008-278233; Office action dated Mar. 8, 2011; 2 pages.

* cited by examiner

*Primary Examiner* — Michael Lebentritt
(74) *Attorney, Agent, or Firm* — SNR Denton US LLP

(57) ABSTRACT

The present invention provides an organic EL display and a method of manufacturing the same capable of assuring excellent electric connection between an auxiliary wiring and a second electrode without using large-scale equipment. The organic EL display includes: a plurality of pixels each having, in order from a substrate side, a first electrode, an organic layer including a light emission layer, and a second electrode; an auxiliary wiring disposed in a periphery region of each of the plurality of pixels and conducted to the second electrode; and another auxiliary wiring disposed apart from the auxiliary wiring at least in a part of outer periphery of a formation region of the auxiliary wiring in a substrate surface.

6 Claims, 16 Drawing Sheets

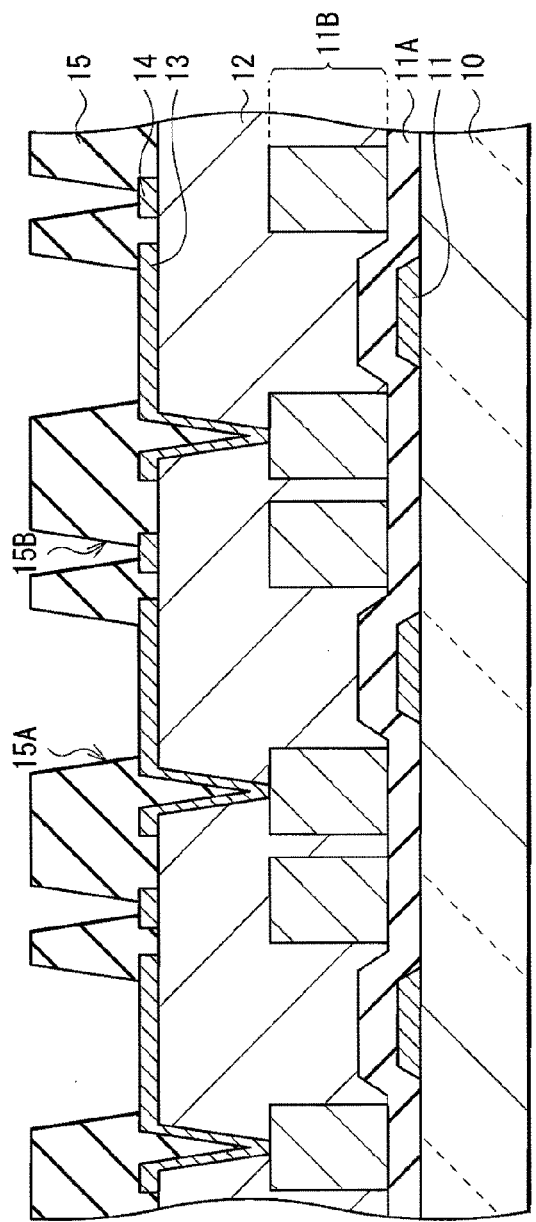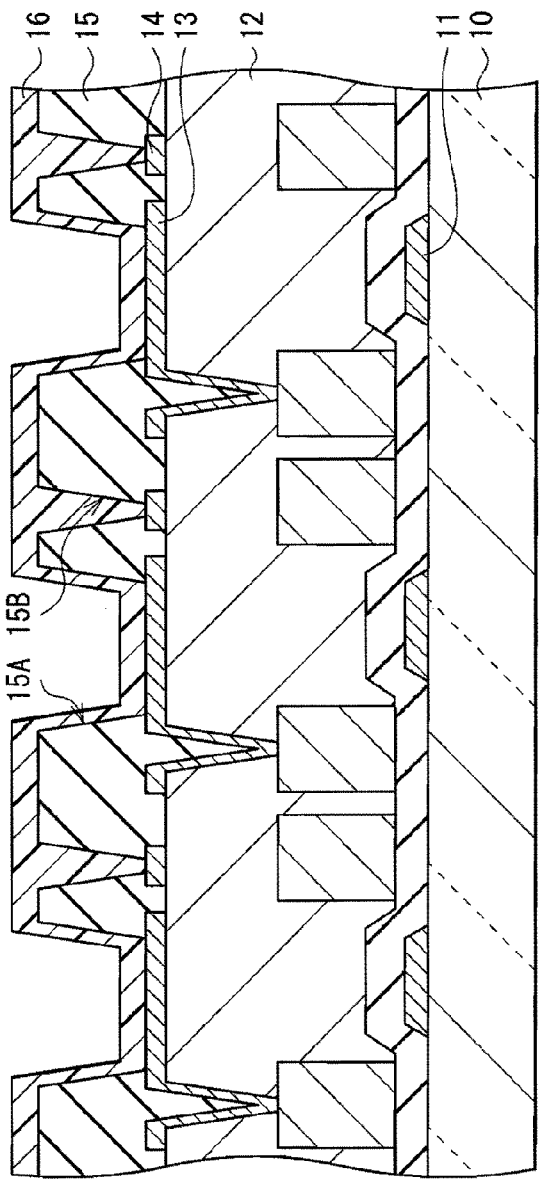
FIG. 5A
FIG. 5B

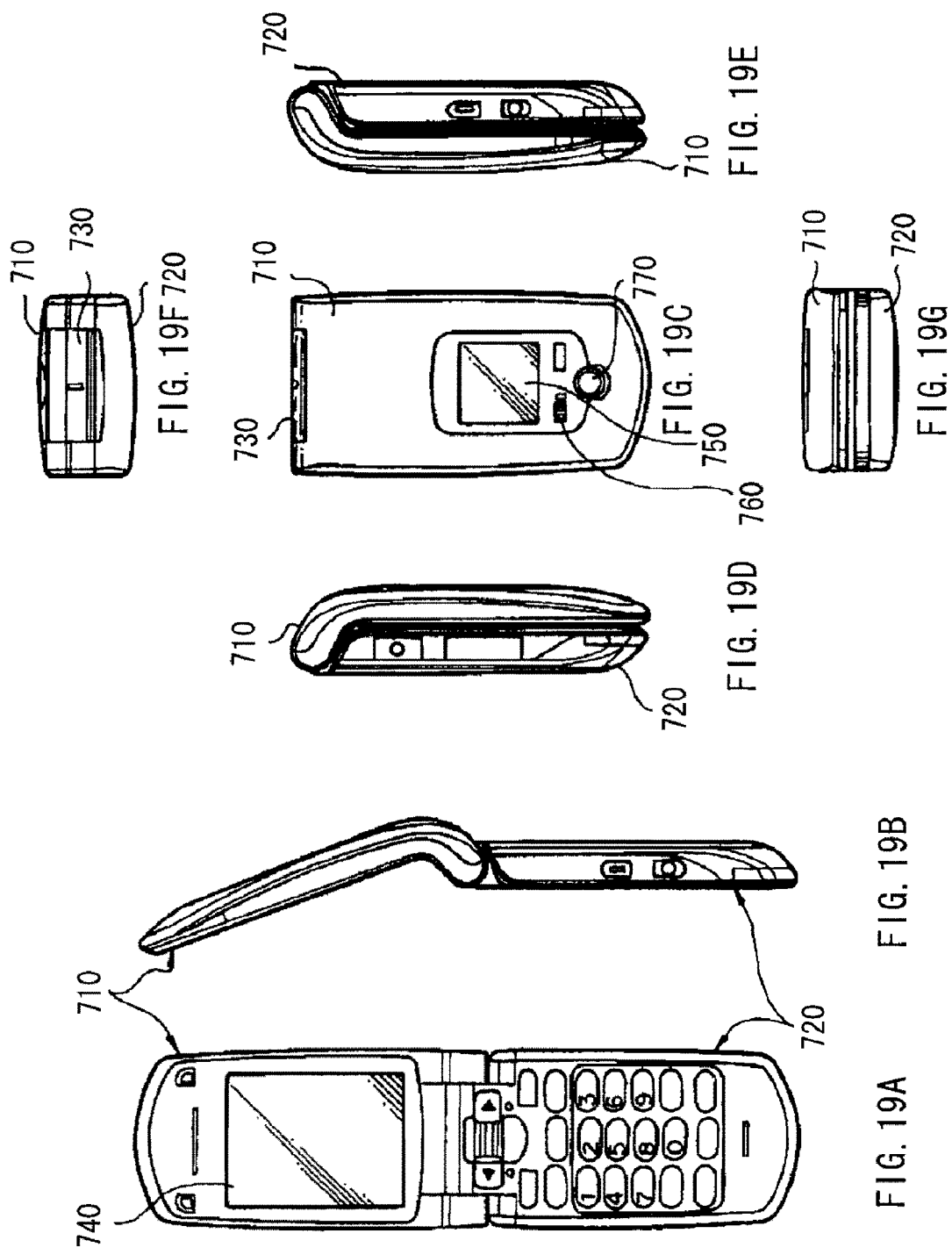

ORGANIC EL DISPLAY AND METHOD OF MANUFACTURING THE SAME

BACKGROUND OF THE INVENTION

1. Field of the Invention

The present invention relates to an organic EL display provided with an auxiliary wiring and a method of manufacturing the same.

2. Description of the Related Art

In recent years, attention is being paid to an organic EL element using an electro luminescence (EL) phenomenon of an organic material as a light emitting element capable of emitting high-luminance light by low-voltage DC driving. As a method of driving a display device (organic EL display) using the organic EL element, a simple matrix method and an active matrix method are mentioned. In the case where the number of pixels is large, the active matrix method is suitable.

In an organic EL display of the active matrix method, a thin film transistor for driving each pixel (organic EL element), a first electrode connected to the thin film transistor, an organic layer including a light emission layer, and a second electrode are provided in this order on a substrate. In such an organic EL display, to assure the aperture ratio of each pixel, it is preferable to extract light from the side opposite to the substrate, that is, to employ the surface emission structure (called "surface emission type" below). In the organic EL display of the surface emission type, the second electrode is made of a transparent or semi-transparent electrode material.

However, such a transparent electrode material has generally a high electric resistance value and the second electrode is formed as an electrode common to the pixels. Consequently, in an organic EL display of the surface emission type, a voltage drop easily occurs in the second electrode. It causes significant deterioration in display performance. To suppress occurrence of such a voltage drop, a method of providing an auxiliary wiring in a region between pixels is used. Concretely, an auxiliary wiring electrically insulated from the first electrode is disposed on the first electrode side on the substrate and is electrically connected to the second electrode.

In many cases, an organic layer is formed on an entire surface of the substrate. Since the organic layer is formed also on the auxiliary wiring, there is the possibility that contact between the auxiliary wiring and the second electrode deteriorates due to the organic layer. Even in the case of forming an organic layer on a pixel unit basis with a mask, if mask positioning precision or precision of processing the opening in the mask is low, the organic layer is formed on the auxiliary wiring, and it results in deterioration in contact with the second electrode.

Therefore, methods of selectively removing the organic layer on the auxiliary wiring by irradiating a region on the auxiliary wiring in the organic layer with a laser beam were proposed as described in, for example, Japanese Unexamined Patent Application Publication Nos. 2005-11810 and 2006-286493.

SUMMARY OF THE INVENTION

However, in Japanese Unexamined Patent Application Publication Nos. 2005-11810 and 2006-286493, laser beam irradiating equipment is necessary. The irradiation position and the like have to be strictly aligned, so that it causes increase in tact time and complication in processes.

It is therefore desirable to provide an organic EL display and a method of manufacturing the same capable of assuring excellent electric connection between an auxiliary wiring and a second electrode by a simple process without using large-scale equipment.

According to an embodiment of the present invention, there is provided an organic EL display including: a plurality of pixels each having, in order from a substrate side, a first electrode, an organic layer including a light emission layer, and a second electrode; an auxiliary wiring disposed in a periphery region of each of the plurality of pixels and conducted to the second electrode; and another auxiliary wiring disposed apart from the auxiliary wiring at least in a part of outer periphery of a formation region of the auxiliary wiring in a substrate surface.

According to an embodiment of the present invention, there is provided a method of manufacturing an organic EL display including the steps of: forming a first electrode for each of pixels on a substrate; forming an auxiliary wiring in a peripheral region of each of the pixels on the substrate; forming another auxiliary wiring so as to be electrically insulated from the auxiliary wiring; forming an organic layer including a light emission layer over the first electrode and the auxiliary wiring; forming a connection hole in a region corresponding to the auxiliary wiring in the organic layer by applying a reverse bias voltage to the organic layer via the auxiliary wiring and the another auxiliary wiring; and forming a second electrode so as to bury the connection hole on the organic layer.

In the method of manufacturing an organic EL display of an embodiment of the invention, by applying a reverse bias voltage to the organic layer through an auxiliary wiring and another auxiliary wiring formed so as to be electrically insulated, only the region on the auxiliary wiring in the organic layer is selectively removed. By burying the removed region as a connection hole with the second electrode, excellent electric connection between the auxiliary wiring and the second electrode is assured.

According to the method of manufacturing an organic EL display of an embodiment of the invention, another auxiliary wiring is formed so as to be electrically insulated from an auxiliary wiring. After that, a reverse bias voltage is applied to an organic layer via the auxiliary wiring and the another auxiliary wiring. Consequently, without using a laser beam irradiating apparatus and without performing precision alignment, the organic layer formed on the auxiliary wiring is removable. Therefore, without using large-scale equipment, by a simple process, excellent electric connection between the auxiliary wiring and the second electrode may be assured. As a result, in the organic EL display of an embodiment of the invention, occurrence of voltage drop in the second electrode is suppressed effectively, so that excellent display quality is maintained more easily.

Other and further objects, features and advantages of the invention will appear more fully from the following description.

BRIEF DESCRIPTION OF THE DRAWINGS

FIGS. 5A and 5B are cross sections illustrating a process subsequent to FIGS. 4A and 4B.

FIGS. 19A to 19G are perspective views illustrating the appearance of application example 5 of the display device of the embodiment.

DETAILED DESCRIPTION OF THE PREFERRED EMBODIMENTS

Embodiments of the present invention will be described in detail hereinbelow with reference to the drawings.

Figure 1:
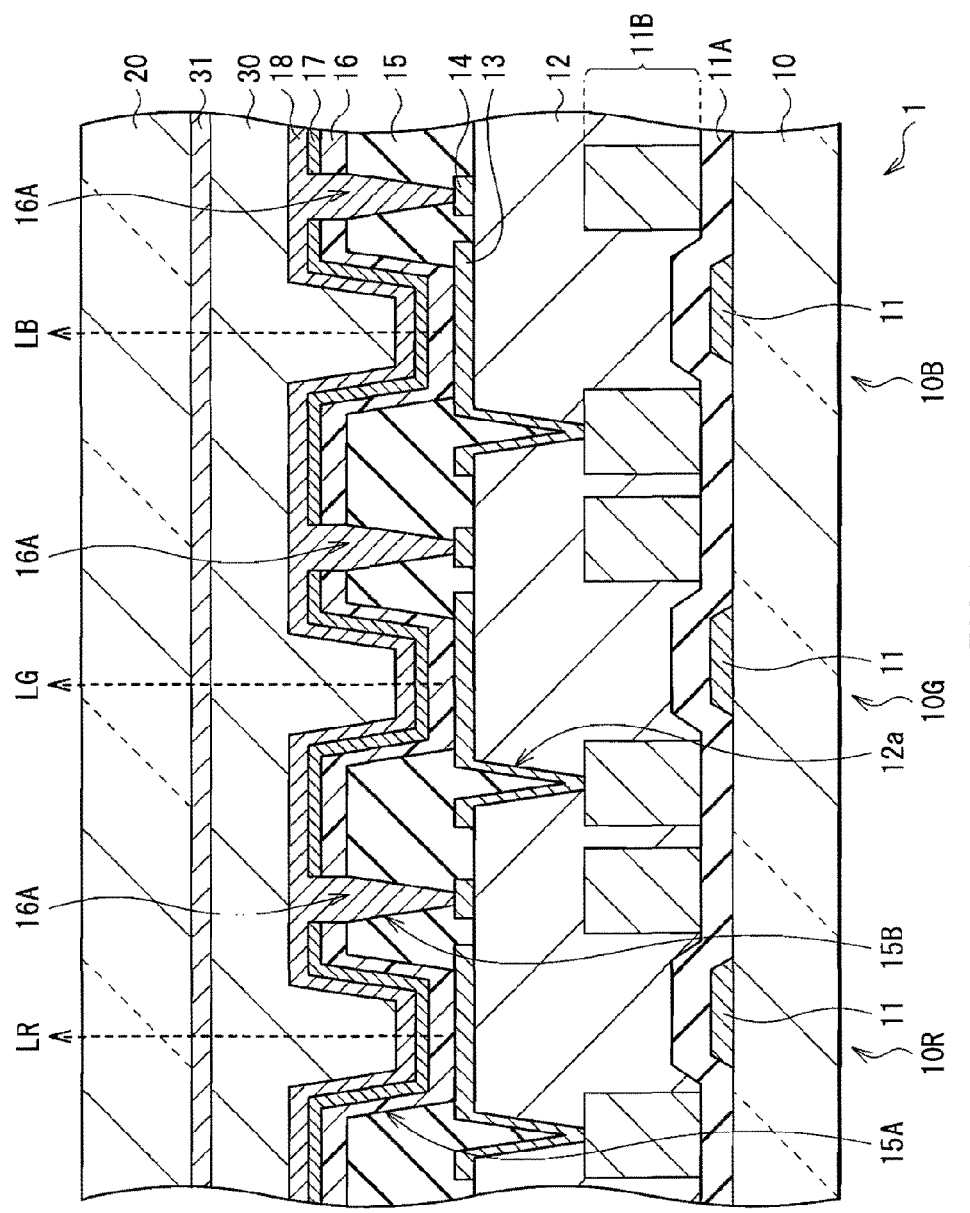
FIG. 1 is a cross section illustrating a schematic configuration of an organic EL display according to an embodiment of the present invention.

FIG. 1 illustrates a sectional structure of an organic EL display 1 according to an embodiment of the present invention. The organic EL display 1 is suitably used as a thin organic EL display and is a display device of an active matrix type for individually driving a plurality of pixels arranged in a matrix. In the organic EL display 1, on a drive-side substrate 10 made of glass or the like, an organic EL element 10R as an R (red) pixel, an organic EL element 10G as a G (green) pixel, and an organic EL element 10B as a B (blue) pixel are provided in order in a matrix. Over the drive-side substrate 10, a pixel drive circuit (the details will be described later) including TFTs (Thin Film Transistors) 11 for driving the organic EL elements 10R, 10G, and 10B and a planarization layer 12 are formed. Over the planarization layer 12, the organic EL elements 10R, 10G, and 10B are provided. The organic EL elements 10R, 10G, and 10B on the drive-side substrate 10 are sealed by a sealing-side substrate 20 with a protection film 30 and an adhesive layer 31 in between.

The TFTs 11 are drive elements for driving the organic EL elements 10R, 10G, and 10B by the active matrix method and may be of the bottom gate type or the top gate type. The gate of the TFT 11 is connected to a scan drive circuit, and the source and drain (which are not illustrated) are connected to a wiring layer 11B provided with an interlayer insulating film 11A made of, for example, oxide silicon or PSG (Phospho-Silicate Glass) in between. The wiring layer 11B is constructed by, for example, a single-layer film made of aluminum (Al) only or an aluminum alloy, a stack film of titanium (Ti) and aluminum, or a three-layer film of titanium, aluminum, and titanium. Over the TFT 11, the interlayer insulating film 11A, and the wiring layer 11B, the planarization layer 12 is formed.

The planarization layer 12 is provided to planarize the surface of the drive-side substrate 10 on which the TFTs 11 are formed and to make the thickness of each of the layers in the organic EL elements 10R, 10G, and 10B uniform. The planarization layer 12 is made of an insulating material and, as will be specifically described later, also plays the role of bringing electric insulation between an auxiliary wiring 14 and a reverse bias wiring 17B. As the insulating material, for example, an organic material such as polyimide resin, acrylic resin, or novolac resin, or an inorganic material such as silicon oxide ($SiO_2$) may be used. In such a planarization layer 12, a contact hole 12a is provided for each pixel. A first electrode 13 which will be described later is buried in the contact hole 12a, thereby assuring electric connection to the wiring layer 11B. In the embodiment, over the planarization layer 12, the auxiliary wiring 14 and the reverse bias wiring 17B which will be described later are disposed.

In the organic EL elements 10R, 10G, and 10B, for example, over the planarization layer 12, the first electrode 13 as an anode and the auxiliary wiring 14 are disposed. Over them, an inter-pixel insulating film 15, an organic layer 16 including a light emission layer, a reverse bias electrode 17, and a second electrode 18 as a cathode are stacked in this order. The organic layer 16, the reverse bias electrode 17, and the second electrode 18 are provided as layers common to the pixels, for all of the pixels.

The first electrode 13 is disposed for each pixel on the planarization layer 12 and functions as an electrode for injecting holes to the organic layer 16. In the case of a surface emitting type as described above, the first electrode 13 is used also as a reflection layer, so it is desirable to have reflectance as high as possible from the viewpoint of increasing luminance efficiency. For example, as the material of the first electrode 13, a metal element itself such as silver (Ag), aluminum, molybdenum (Mo), or chromium (Cr) or its alloy is used and thickness is, for example, 100 nm to 500 nm both inclusive. The first electrode 13 may have a single-layer structure or a multilayer structure.

The auxiliary wiring 14 is provided to suppress voltage drop in the second electrode 18, electrically insulated from the first electrode 13 and conducted to the second electrode 18. For example, the auxiliary wiring 14 is disposed in the periphery region of the first electrode 13 on the planarization layer 12. On the other hand, in the inter-pixel insulating film 15, the organic layer 16, and the reverse bias electrode 17 provided over the auxiliary wiring 14, contact holes 16A are provided so as to penetrate to the auxiliary wiring 14. Via the contact holes 16A, the auxiliary wiring 14 and the second electrode 18 are made conductive. Although the details will be described later, the auxiliary wiring 14 is disposed in a region between the pixels and is also disposed in all of pixel regions arranged in a matrix, that is, in the outer peripheral region surrounding the display region. The reverse bias wiring 17B (not illustrated in FIG. 1, the details will be described later) is disposed in an outer peripheral region of the formation region of the auxiliary wiring 14. The reverse bias wiring 17B is connected to the reverse bias electrode 17 in the outer periphery region.

The auxiliary wiring 14 may be made of a conductive material different from that of the first electrode 13 but, preferably, made of the same material as that of the first electrode 13. When the auxiliary wiring 14 and the first electrode 13 are made of the same material, the auxiliary wiring 14 and the first electrode 13 are allowed to be patterned in the same process in a manufacturing process which will be described later, so that the man-hour is reduced. The detailed configuration of the auxiliary wiring 14 will be described later.

The inter-pixel insulating film 15 is provided to bring electric insulation between the first and second electrodes 13 and 18 and between the first electrode 13 and the auxiliary wiring 14. The inter-pixel insulating film 15 is made of, for example, an insulating material such as silicon oxide or polyimide. In the inter-pixel insulating film 15, an opening 15A corresponding to the first electrode 13 and an opening 15B corresponding to the auxiliary wiring 14 are provided. In the opening 15A, the organic layer 16, the reverse bias electrode 17, and the second electrode 18 are stacked in this order. In the opening 15B, the second electrode 18 is buried. That is, the region corresponding to the opening 15A is a light emitting region in each of the organic EL elements 10R, 10G, and 10B and the opening 15B functions as a part of the contact hole 16A.

The organic layer 16 is formed so as to cover the side faces and the top face of the inter-pixel insulating film 15 and the top face of the first electrode 13 exposed by the opening 15A. The organic layer 16 is interrupted around just above the opening 15B in the inter-pixel insulating film 15 and serves as a part of the contact hole 16A. A concrete configuration of the organic layer 16 will be described below.

The organic layer 16 has the same stack-layer structure regardless of the light emission colors of the organic EL elements 10R, 10G, and 10B. For example, in order from the side of the first electrode 13, a hole injection layer, a hole transport layer, a red light emission layer, a green light emission layer, a blue light emission layer, and an electron transport layer are stacked. The hole injection layer is provided to increase the hole injection efficiency and is made of, for example, 4,4',4''-tris(3-methylphenylamino) triphenylamine (m-MTDATA) or 4,4',4''-tris(2-naphthylfenylamino) triphenylamine (2-TNATA). The hole transport layer is provided to increase the hole injection efficiency and is made of, for example, 4,4'-bis(N-1-naphthyl-N-fenylamino) biphenyl (α-NPD).

When an electric field is applied, each of the red light emission layer, the green light emission layer, and the blue light emission layer emits light of red, green, and blue, respectively, by recombining a part of holes injected from the first electrode 13 side and a part of electrons injected from the second electrode 18 side. Each of the color light layers includes an organic material such as styryl amine derivative, aromatic amine derivative, perylene derivative, coumarin derivative, pyran-series dye, triphenyl amine derivative, or the like. Since the light emission layers of three colors are stacked in the thickness direction, white color as a whole is emitted upward of the second electrode 18.

The electronic transport layer is provided to increase the efficiency of injecting electrons to the color light emission layers and is made of, for example, 8-hydroxyquinoline aluminum (Alq$_3$). On the electron transport layer, the reverse bias electrode 17 is disposed. Between the electron transport layer in the organic layer 16 and the reverse bias electrode 17, an electron injection layer for increasing the electron injection efficiency may be further provided. Examples of the material of the electron injection layer include alkali metal oxides such as $Li_2O$, $Cs_2O$, LiF, and $CaF_2$, alkali metal fluoride, alkaline-earth metal oxide, and alkaline-earth fluoride.

The reverse bias electrode 17 is, like the organic layer 16, interrupted around just above the opening 15B in the inter-pixel insulating film 15 and serves as a part of the contact hole 16A. Although the details will be described later, the reverse bias electrode 17 is provided to assure electric connection between the auxiliary wiring 14 and the second electrode 18 by forming the contact hole 16A above the auxiliary wiring 14 in the manufacturing process. Examples of the material of the reverse bias electrode 17 include transparent or semi-transparent electrode materials such as indium tin oxide (ITO), zinc oxide (ZnO), magnesium silver alloy (MgAg), and indium zinc oxide (IZO). It is preferable to select the same material as that of the second electrode 18 as the material of the reverse bias electrode 17 from the viewpoints of simplification of the manufacturing process of the reverse bias electrode 17 and the second electrode 18 and the connection resistance. The thickness of the reverse bias electrode 17 is, for example, 3 nm to 20 nm. The detailed configuration of the reverse bias electrode 17 will be described later.

The second electrode 18 functions as an electrode for injecting electrons to the organic layer 16. In the case of surface emission type, the material of the second electrode 18 is, for example, a material having conductivity and light transmittance, for example, a transparent or semi-transparent electrode material such as indium tin oxide, zinc oxide, magnesium silver alloy, or indium zinc oxide.

The protection film 30 is made of a transparent dielectric material such as silicon oxide ($SiO_2$) or silicon nitride (SiN). The adhesive layer 31 is made of, for example, a thermoset resin, an ultraviolet curable resin, or the like.

A sealing-side substrate 20 is provided to seal the organic EL elements 10R, 10G, and 10B in cooperation with the adhesive layer 31. The sealing-side substrate 20 is made of a material such as glass which is transparent to light generated by the organic EL elements 10R, 10G, and 10B. The sealing-side substrate 20 is provided with color filters (not illustrated) of red, green, and blue in correspondence with the disposition of the organic EL elements 10R, 10G, and 10B, respectively. With the configuration, white light generated by the organic EL elements 10R, 10G, and 10B is taken as light of three primary colors, external light reflected by the layers is absorbed, and contrast is improved. The color filters may be provided for the drive-side substrate 10. Between the color filters, a black matrix may be provided.

Figure 2:
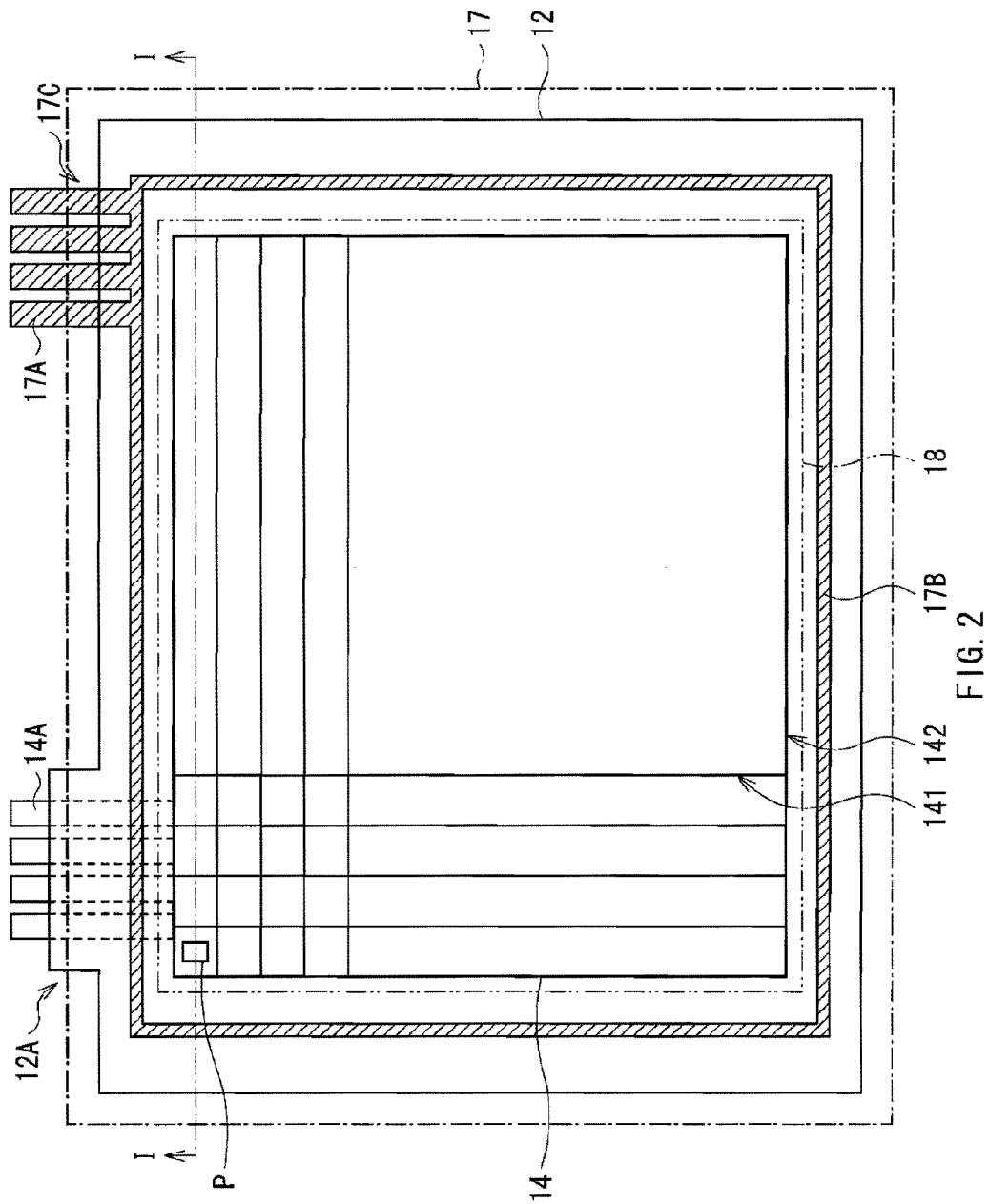
FIG. 2 is a diagram illustrating a plane configuration of an auxiliary wiring, a reverse bias wiring, and the like illustrated in FIG. 1.

Referring now to FIG. 2, the detailed configuration of the auxiliary wiring 14, the reverse bias electrode 17, and the reverse bias wiring 17B will be described. FIG. 2 schematically illustrates a plane configuration of the auxiliary wiring 14 and the reverse bias wiring 17B over the planarization layer 12 and the formation regions of the reverse bias electrode 17 and the second electrode 18. A cross section taken along line I-I of FIG. 2 corresponds to FIG. 1.

The auxiliary wiring 14 is disposed in an inter-pixel region 141 between the organic EL elements 10R, 10G, and 10B (for simplicity, called pixels P) and a peripheral region 142 surrounding all of the pixels P arranged in a matrix (hereinbelow, called a display region). That is, the plane shape of the auxiliary wiring 14 is a shape obtained by partitioning the inside of the rectangular frame in a lattice shape in the substrate face. The reverse bias wiring 17B is disposed so as to further surround the peripheral region 142 of the auxiliary wiring 14 from the outside and so as to be apart from the auxiliary wiring 14.

The reverse bias wiring 17B may be made of a material different from that of the first electrode 13 and the auxiliary wiring 14 but, preferably, made of the same material as that of the first electrode 13 and the auxiliary wiring 14. When the reverse bias wiring 17B is made of the same material as that of the first electrode 13 and the auxiliary wiring 14, the first electrode 13, the auxiliary wiring 14, and the reverse bias wiring 17B are allowed to be patterned in the same process in a manufacturing process which will be described later.

Over the auxiliary wiring 14, as described above, the organic layer 16 (not illustrated in FIG. 2) is formed in the entire display region. Over the planarization layer 12, the organic layer 16 is provided on the outside of the peripheral region 142 of the auxiliary wiring 14 and on the inside of the formation region of the reverse bias wiring 17B. That is, the auxiliary wiring 14 is covered with the organic layer 16 and, on the other hand, the reverse bias wiring 17B is exposed from the organic layer 16.

The reverse bias electrode 17 is disposed on the entire face of the planarization layer 12 (for example, the region surrounded by an alternate long and short dash line in FIG. 2) so as to cover the organic layer 16 and the formation region of the reverse bias wiring 17B exposed from the organic layer 16. Over the reverse bias electrode 17, the second electrode 18 is provided from the display region to the region on the outside of the peripheral region 142 of the auxiliary wiring 14 and the inside of the formation region of the reverse bias wiring 17B (for example, the region surrounded by an alternate long and two short dashes line in FIG. 2).

To the auxiliary wiring 14 and the reverse bias wiring 17B, voltage application pads (first and second pads 14A and 17A) are attached, respectively. The first and second pads 14A and 17A are provided to apply reverse bias voltage to the organic layer 16 via the auxiliary wiring 14 and the reverse bias wiring 17B (reverse bias electrode 17), respectively, in the manufacturing process which will be described later.

The first pad 14A is attached to a part of the peripheral region 142 of the auxiliary wiring 14. The first pad 14A is formed, for example, together with the wiring layer 11B over the interlayer insulating film 11A and is in contract with the auxiliary wiring 14 via an opening part (not illustrated) formed in the planarization layer 12. On the other hand, a part facing the reverse bias electrode 17 and the reverse bias wiring 17B, of the first pad 14A is covered with, for example, a part (covering part 12A) of the planarization layer 12. In such a manner, the auxiliary wiring 14 and the first pad 14A are disposed so as not to be in direct contact with both of the reverse bias electrode 17 and the reverse bias wiring 17B.

The second pad 17A is attached to a part of the reverse bias wiring 17B. The second pad 17A has an exposed part 17C which is exposed from the planarization layer 12. In such a manner, the reverse bias wiring 17B and the second pad 17A are at least partially in direct contact with the reverse bias electrode 17.

In the embodiment, the auxiliary wiring 14 corresponds to an example of the "auxiliary wiring" of the present invention, the reverse bias wiring 17B corresponds to an example of the "another auxiliary wiring", and the reverse bias electrode 17 corresponds to an example of the "third electrode".

The organic EL display 1 may be manufactured, for example, as follows.

Figure 3A:
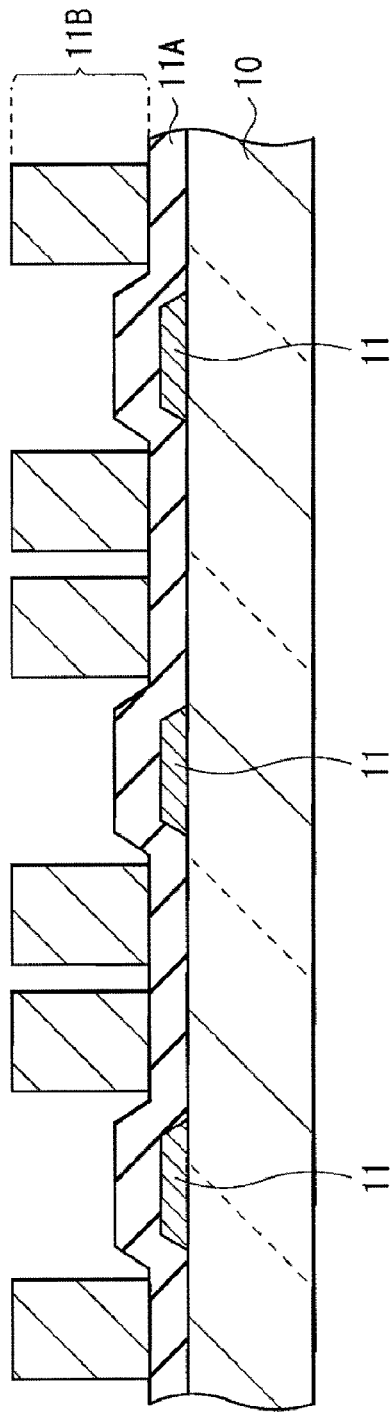
FIGS. 3A and 3B are cross sections illustrating a method of manufacturing the organic EL display illustrated in FIG. 1 in process order.

FIGS. 3A and 3B to FIG. 8 illustrate a method of manufacturing the organic EL display 1 in process order. First, as illustrated in FIG. 3A, the TFTs 11 and the interlayer insulating film 11A are formed on the drive-side substrate 10 by a known thin film process. After that, on the interlayer insulating film 11A, the wiring layer 11B made of the above-described material is formed. A single-layer film or a multilayer film is formed using the above-described material by, for example, sputtering or the like and, after that, the wiring layer 11B is patterned by using, for example, the lithography method. Simultaneously, the first pads 14 are formed over the interlayer insulating film 11A.

Figure 3B:
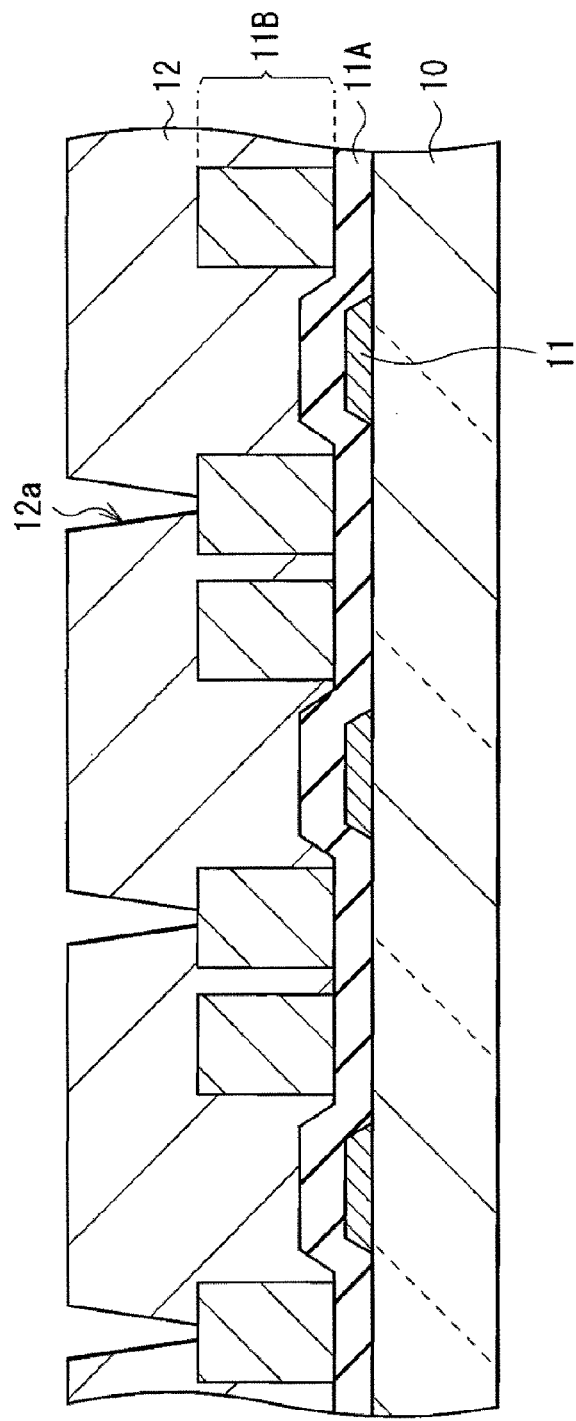

After that, as illustrated in FIG. 3B, the planarization layer 12 made of the above-described material is formed by, for example, spin coating on the entire surface of the drive-side substrate 10. After that, for example, by using the photolithography method, the opening 12a is formed in a region corresponding to the wiring layer 11B. Simultaneously, an opening (not illustrated) for making the first pad 14A and the auxiliary wiring 14 contact with each other is formed.

Figure 4A:
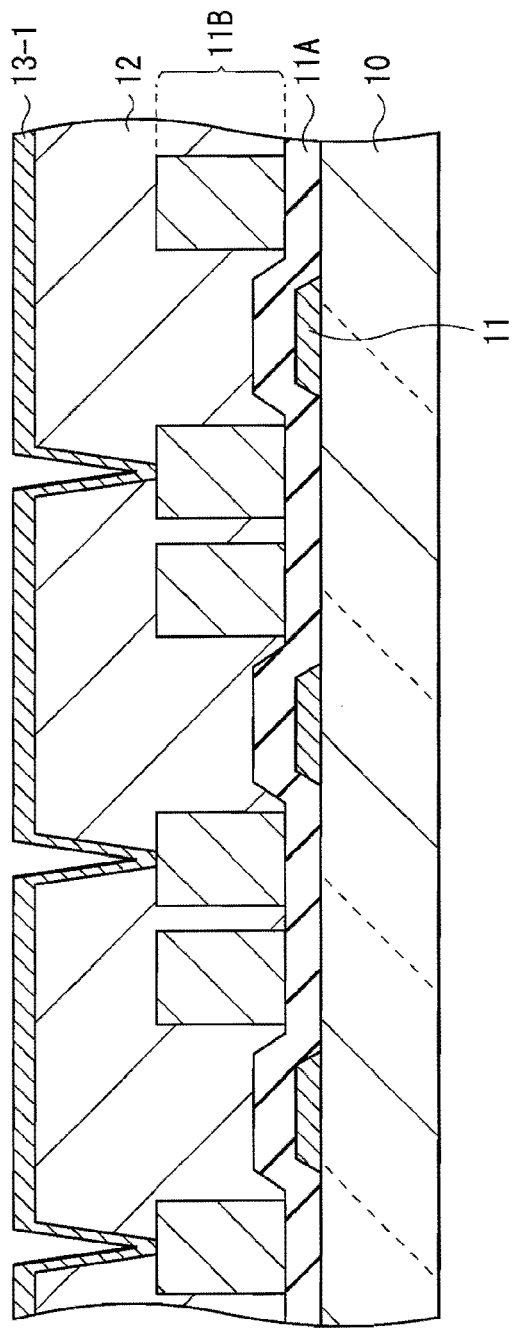
FIGS. 4A and 4B are cross sections illustrating a process subsequent to FIGS. 3A and 3B.
Figure 4B:
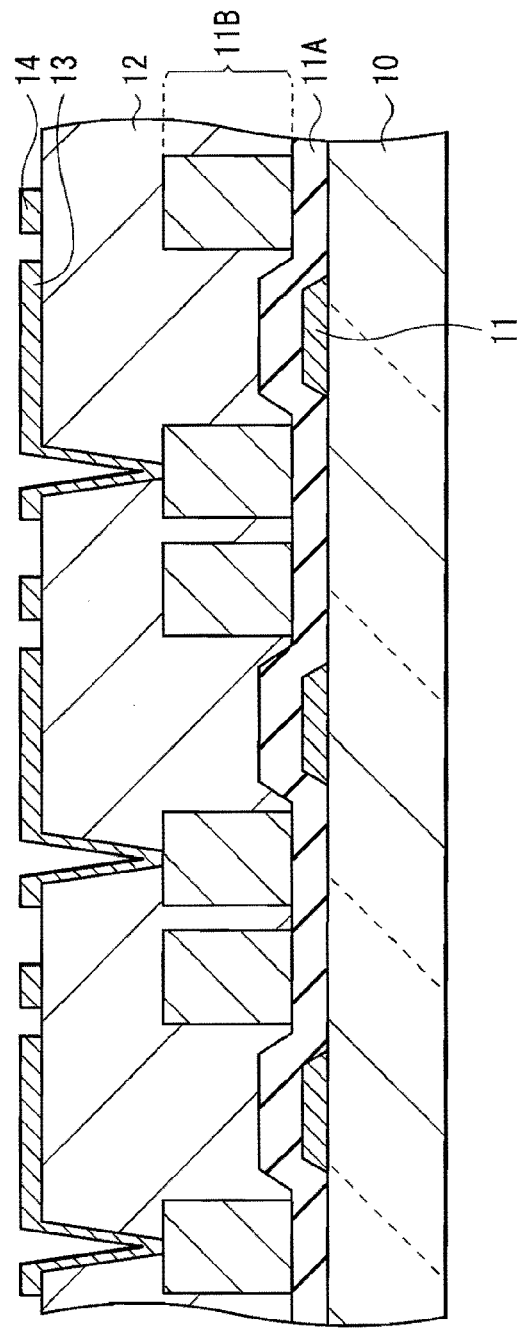

Subsequently, as illustrated in FIG. 4A, a metal layer 13-1 is formed on the entire surface of the planarization layer 12 by, for example, sputtering. The metal layer 13-1 is made of the material constructing the first electrode 13, the auxiliary wiring 14, and the reverse bias wiring 17B (not illustrated in FIGS. 4A and 4B). As illustrated in FIG. 4B, for example, by using the lithography method, the first electrode 13 is patterned in each pixel region, and the auxiliary wiring 14 is patterned in the peripheral region of the first electrode 13. Further, as illustrated in FIG. 2, the reverse bias wiring 17B is simultaneously patterned in the peripheral region of the auxiliary wiring 14 so as to be apart from the auxiliary wiring 14. After that, the second pad 17A is attached to the reverse bias wiring 17B. As a result, the auxiliary wiring 14 and the first pad 14A are electrically connected, and the reverse bias wiring 17B and the second pad 17A are electrically connected.

Subsequently, as illustrated in FIG. 5A, on the first electrode 13 and the auxiliary wiring 14 formed, the inter-pixel insulating film 15 made of the above-described material is formed by, for example, CVD (Chemical Vapor Deposition), and the parts corresponding to the first electrode 13 and the auxiliary wiring 14 are selectively removed by using, for example, the lithography method to thereby form the openings 15A and 15B.

As illustrated in FIG. 5B, the organic layer 16 made of the above-described material is formed on the inter-pixel insulating film 15 so as to cover the display region by, for example, the vacuum deposition method. The organic layer 16 is formed in the opening 15A in the inter-layer insulating film 15 and buried in the opening 15B. The organic layer 16 is formed in the region on the inside of the formation region of the reverse bias wiring 17B, and the reverse bias wiring 17B is exposed from the organic layer 16.

Figure 6:
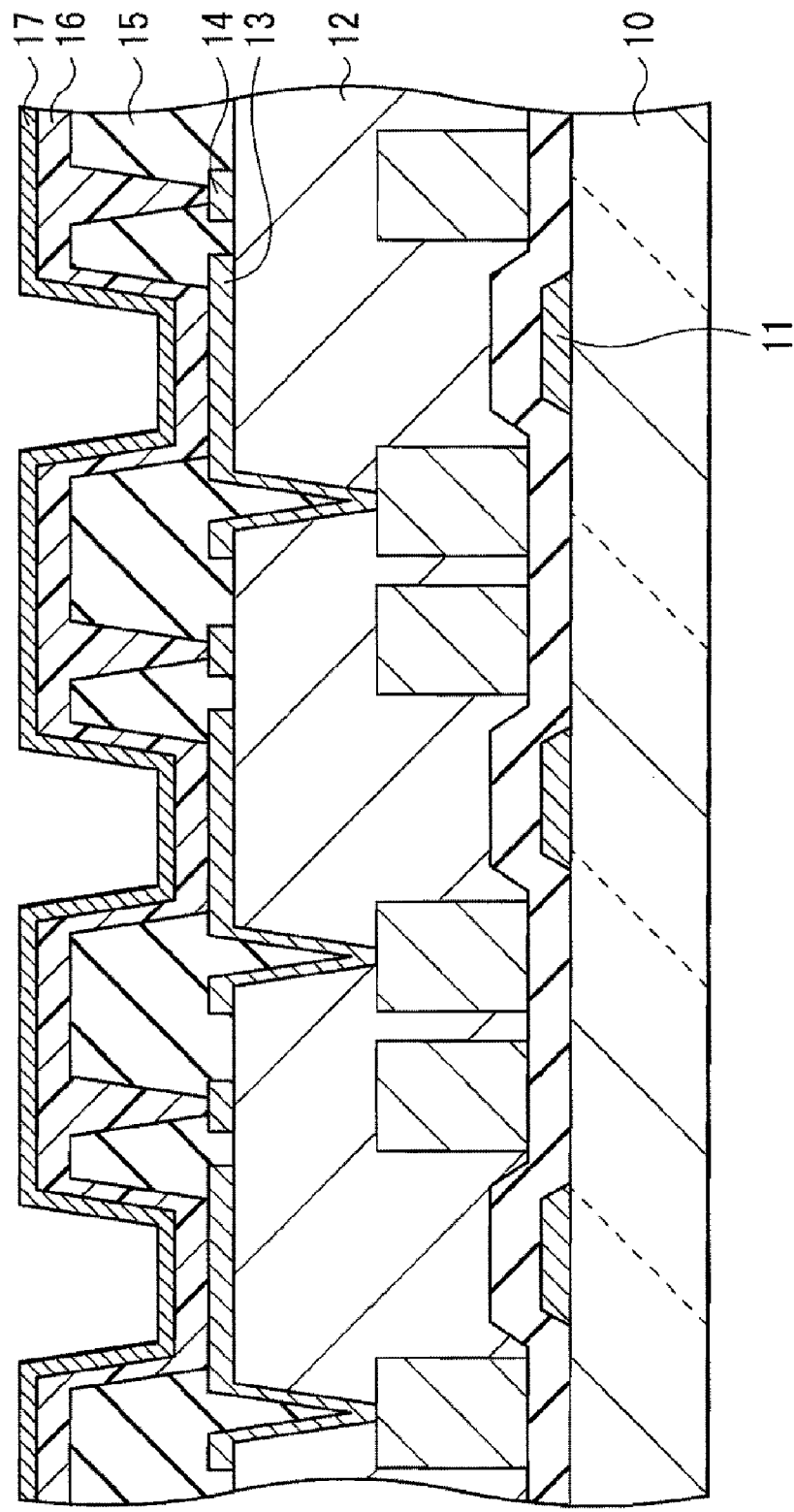
FIG. 6 is a cross section illustrating a process subsequent to FIGS. 5A and 5B.

As illustrated in FIG. 6, the reverse bias electrode 17 made of the above-described material is formed so as to cover the entire surface of the planarization layer 12, that is, the organic layer 16 and the reverse bias wiring 17B on the planarization layer 12 by using, for example, sputtering or the like.

As described above, by forming the reverse bias wiring 17B in the periphery of the auxiliary wiring 14 so as to be apart from the auxiliary wiring 14 over the planarization layer 12, the auxiliary wiring 14 and the reverse bias wiring 17B are electrically insulated from each other. By forming the first pad 14A so as to be covered with the planarization layer 12, the first pad 14A is electrically insulated from both of the reverse bias electrode 17 and the reverse bias wiring 17B. Further, by the organic layer 16 formed so as to cover the entire pixel region, the auxiliary wiring 14 and the reverse bias electrode 17 are electrically insulated from each other.

On the other hand, the reverse bias wiring 17B is formed so as to be exposed from the organic layer 16, and the reverse bias electrode 17 is formed on the entire surface of the planarization layer 12, thereby electrically connecting the reverse bias wiring 17B and the reverse bias electrode 17. By exposing the second pad 17A from the planarization layer 12 and attaching it to the reverse bias wiring 17B, a part of the second pad 17A is electrically connected to the reverse bias electrode 17.

Via the auxiliary wiring 14 and the reverse bias wiring 17B (reverse bias electrode 17) formed as described above, reverse bias voltage is applied to the organic layer 16. Since the auxiliary wiring 14 and the first pad 14A are electrically insulated from both of the reverse bias electrode 17 and the reverse bias wiring 17B, independent potentials are applied across the auxiliary wiring 14 and the reverse bias wiring 17B. Concretely, the drive-side substrate 10 over which the reverse bias electrode 17 is formed is disposed, for example, in oxygen concentration of about 0.1 to 20% and in dew-point temperature atmosphere of −60° or less, a probe comes into contact with each of the first and second pads 14A and 17A, and the potential relation is given so that the reverse bias voltage is applied to the organic layer 16. The reverse bias voltage is a voltage of the degree at which the organic layer 16 is blown, for example, 50V or higher.

Figure 7:
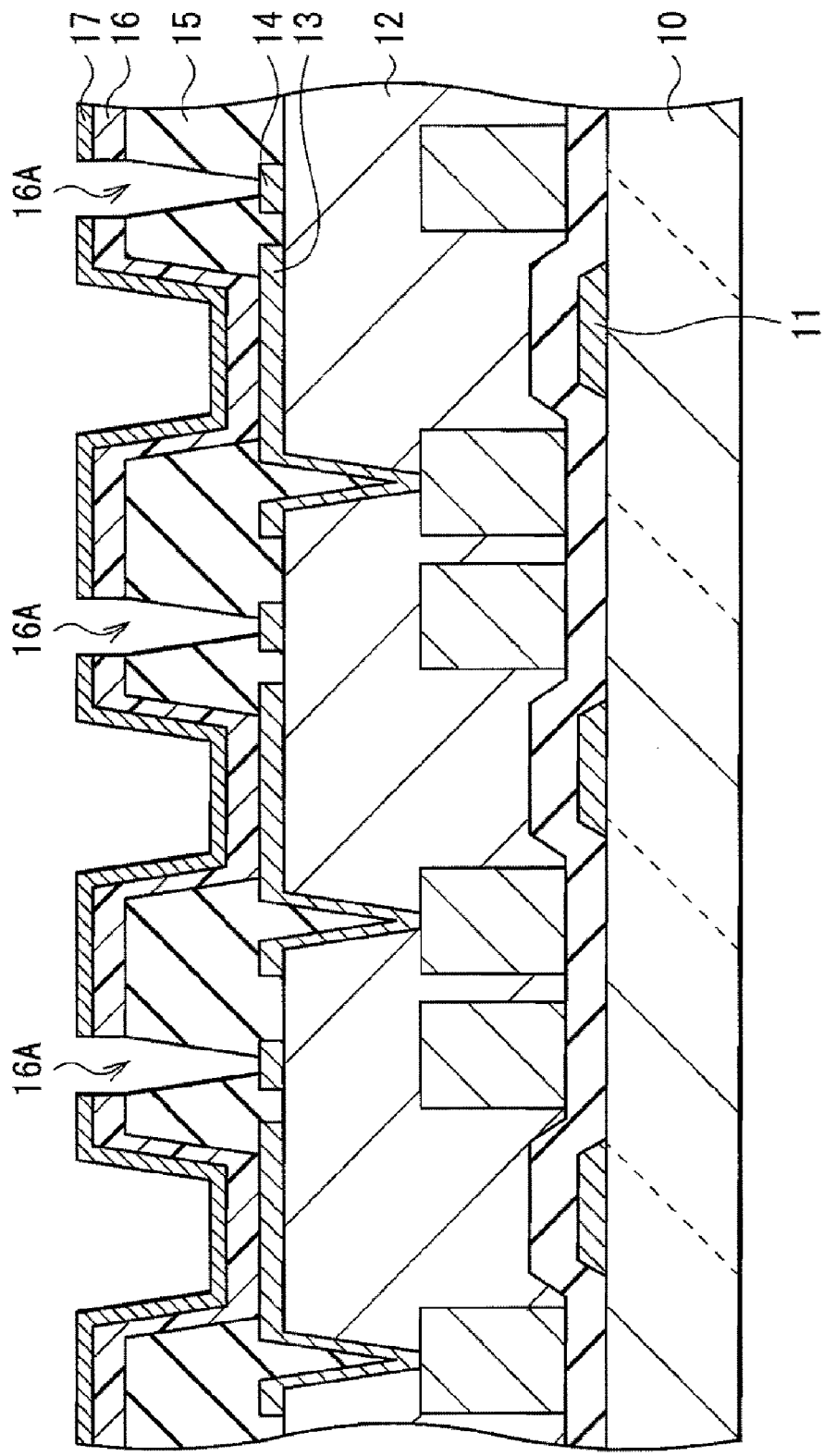
FIG. 7 is a cross section illustrating a process subsequent to FIG. 6.

As illustrated in FIG. 7, only the region above the auxiliary wiring 14, in the organic layer 16 formed over all of the pixels is selectively removed. Simultaneously, only the region corresponding to the auxiliary wiring 14, in the reverse bias electrode 17 formed on the organic layer 16 is selectively removed. In such a manner, the contact hole 16A for assuring electric connection to the second electrode 18 is formed in the region above the auxiliary wiring 14.

Figure 8:
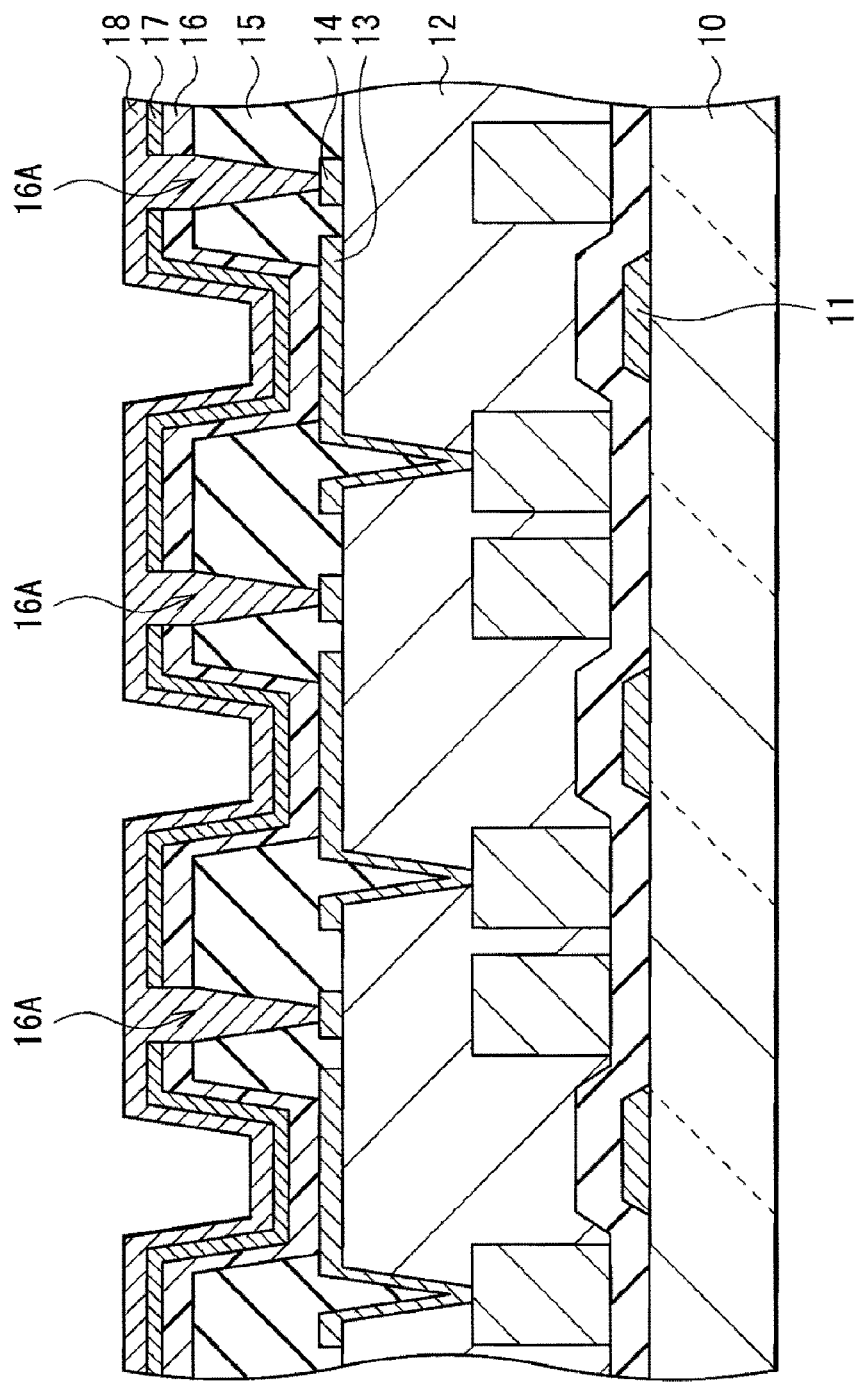
FIG. 8 is a cross section illustrating a process subsequent to FIG. 7.

As illustrated in FIG. 8, on the reverse bias electrode 17, the second electrode 18 made of the above-described material is formed in all of the display region by, for example, sputtering. At this time, the second electrode 18 is formed so as to be buried in the contact hole 16A formed in the organic layer 16. As a result, in the contact hole 16A, the auxiliary wiring 14 and the second electrode 18 are electrically connected to each other. After that, on the second electrode 18, the protection film 30 made of the above-described material is formed.

Finally, the adhesive layer 31 made of, for example, a thermoset resin is applied on the protection film 30 and, after that, the sealing-side substrate 20 is adhered onto the adhesive layer 31. The color filters on the sealing-side substrate 20 and the organic EL elements 10R, 10G, and 10B are relatively aligned, and a predetermined heating process is performed to set the thermoset resin of the adhesive layer 31. As a result, the organic EL display 1 illustrated in FIG. 1 is completed.

In the method of manufacturing the organic EL display of the embodiment, the auxiliary wiring 14 is patterned together with the first electrode 13 on the side of the drive-side substrate 10 and, after that, the organic layer 16 is formed in the entire display region. Since the auxiliary wiring 14 is disposed so as to suppress voltage drop of the second electrode 18, the electric connection to the second electrode 18 formed in a process of a post stage has to be assured. However, in the case of forming the organic layer 16 in all of the display region as described above, the surface of the auxiliary wiring 14 is also covered with the organic layer 16, and it becomes uneasy to assure the electric connection between the auxiliary wiring 14 and the second electrode 18. Conventionally, a method of irradiating the region corresponding to the auxiliary wiring with a laser beam after formation of the organic layer, thereby removing the organic layer above the auxiliary wiring is employed. However, in such a method, large-scale equipment such as a laser beam irradiating apparatus is necessary and a laser beam has to be accurately emitted only to a region corresponding to the auxiliary wiring, so that precise positioning is necessary.

Figure 9:
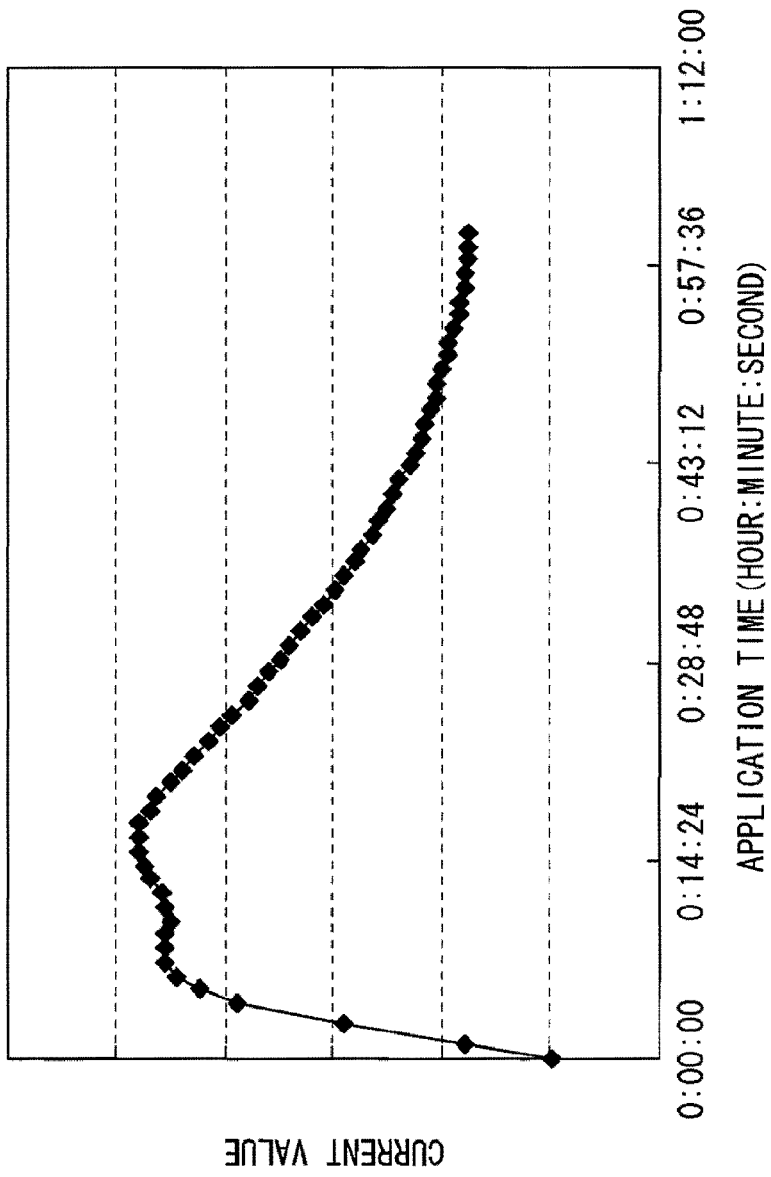
FIG. 9 is a characteristic diagram illustrating current value changes according to an embodiment of the present invention.

In contrast, in the embodiment, the reverse bias electrode 17 and the reverse bias wiring 17B are formed so as to be electrically insulated from the auxiliary wiring 14 with the organic layer 16 in between, and the reverse bias voltage is applied to the organic layer 16 via the auxiliary wiring 14 and the reverse bias wiring 17B. As a result, only the region above the auxiliary wiring 14, in the organic layer 16 is selectively blown and removed. Therefore, without using equipment such as a laser irradiating apparatus and without a precise positioning process, the auxiliary wiring 14 is exposed from the organic layer 16. FIG. 9 illustrates, as an example, changes in a current value with respect to application time (hour:minute:second) in the case where reverse bias voltage of 50V is continuously applied across the auxiliary wiring 14 and the reverse bias wiring 17B under environments of oxygen concentration of 20% and dew temperature of −60° or less. As described above, under the conditions, the current value starts dropping at the time point after about 15 minutes since voltage application. Finally, it was observed that the organic layer 16 over the auxiliary wiring 14 was sufficiently blown after about one hour.

As described above, in the embodiment, without using large-scale equipment, excellent electric connection between the auxiliary wiring 14 and the second electrode 18 is allowed to be assured with the simple process. In the organic EL display 1 of the embodiment, when a predetermined voltage is applied across the first and second electrodes 13 and 18, current is injected to each of the color emission layers of the organic layer 16 and holes and electrons are recombined. As a result, the light becomes white color as a whole and goes out from the second electrode 18 side. The white color light passes through the color filters formed on the sealing-side substrate 20, and is extracted as light of three primary colors. Since the excellent electric connection between the auxiliary wiring 14 and the second electrode 18 is assured, occurrence of voltage drop of the second electrode 18 is suppressed, so that excellent display quality is maintained more easily.

Since the auxiliary wiring 14 and the reverse bias wiring 17B are formed in the same layer, for example, on the planarization layer 12, the auxiliary wiring 14 and the reverse bias wiring 17B may be formed by the same thin film process. Thus, the manufacturing process becomes more facilitated.

A modification of the present invention will be described below with reference to the drawings. The same reference numerals are designated to components similar to those of the foregoing embodiment and their description will not be repeated.

Modification

Figure 10:
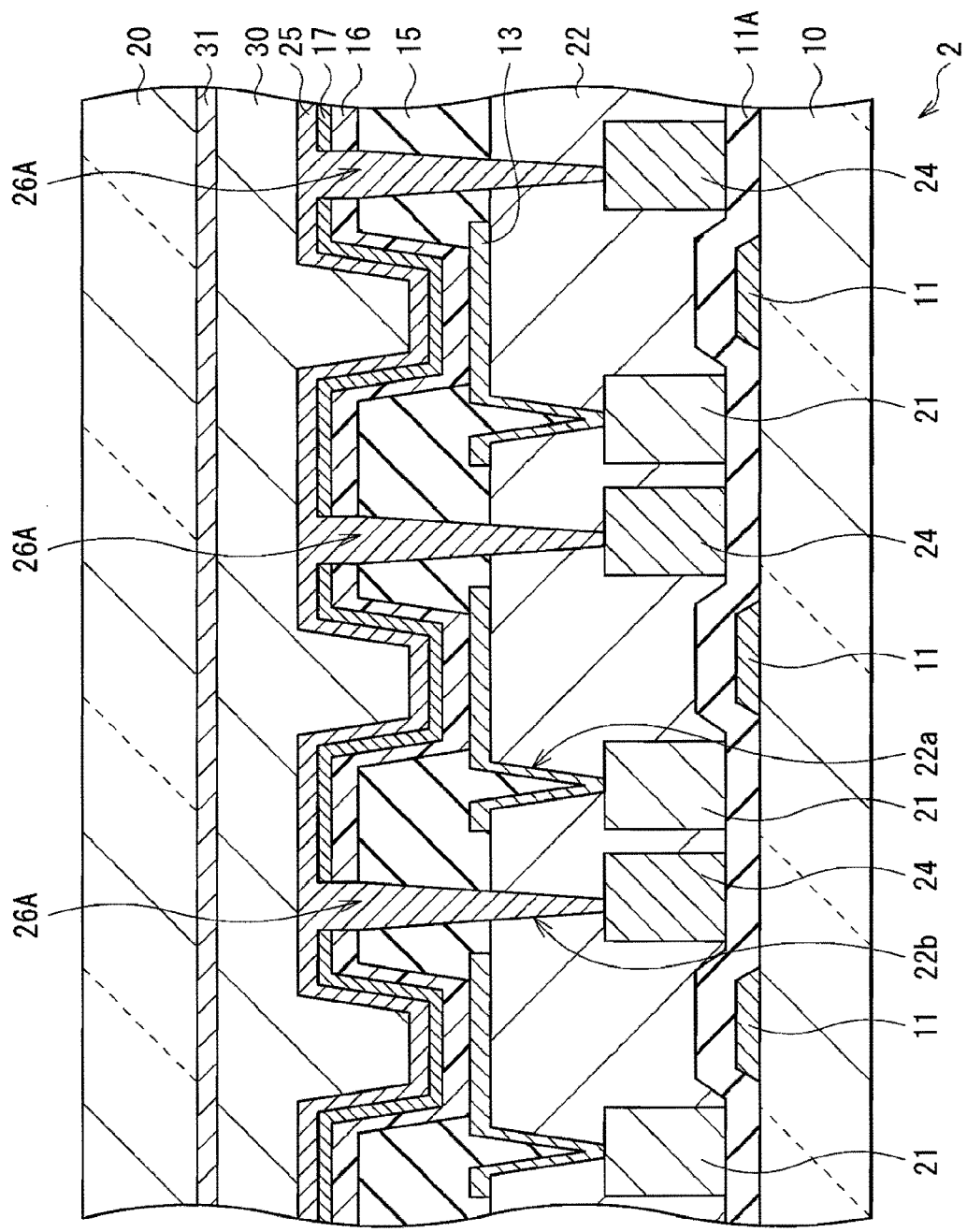
FIG. 10 is a cross section illustrating a schematic configuration of an organic EL display according to a modification of the invention.

FIG. 10 illustrates a sectional structure of an organic EL display 2 according to a modification. Like the organic EL display 1, the organic EL display 2 is a display device of an active matrix type for individually driving a plurality of pixels arranged in a matrix. Also in the organic EL display 2, on the drive-side substrate 10, the organic EL elements 10R, 10G, and 10B as pixels of three primary colors of R, G, and B are provided in order in a matrix. Over the drive-side substrate 10, a pixel drive circuit (the details will be described later) including the TFTs 11 and a planarization layer 22 are formed. Over the planarization layer 22, the organic EL elements 10R, 10G, and 10B are provided.

In the modification, an auxiliary wiring 24 is provided together with a wiring 21 on the interlayer insulating film 11A, and the reverse bias wiring 17B is disposed over the planarization layer 22. That is, the auxiliary wiring 24 and the reverse bias wiring 17B are provided in different layers. Contact holes 26A penetrating the reverse bias electrode 17, the organic layer 16, the inter-pixel insulating film 15, and the planarization layer 22 are provided. A second electrode 25 is buried in the contact hole 26A and is electrically connected to the auxiliary wiring 24. The auxiliary wiring 21 is provided to connect the TFT 11 and the first electrode 13 and is made of a material similar to that of the wiring layer 11B in the foregoing embodiment.

Like the planarization layer 12 of the foregoing embodiment, the planarization layer 22 planarizes the surface of the drive-side substrate 10 on which the TFT 11 is formed and makes the thicknesses of the layers of the organic EL elements 10R, 10G, and 10B uniform. The planarization layer 22 is made of an insulating material similar to that of the planarization layer 12. The planarization layer 22 has a contact hole 22a above the wiring 21, and a contact hole 22b above the auxiliary wiring 24. In the contact hole 22a, the first electrode 13 is buried. In the contact hole 22b, the second electrode 25 is buried. The contact hole 22b is a part of the contact hole 26A.

Figure 11:
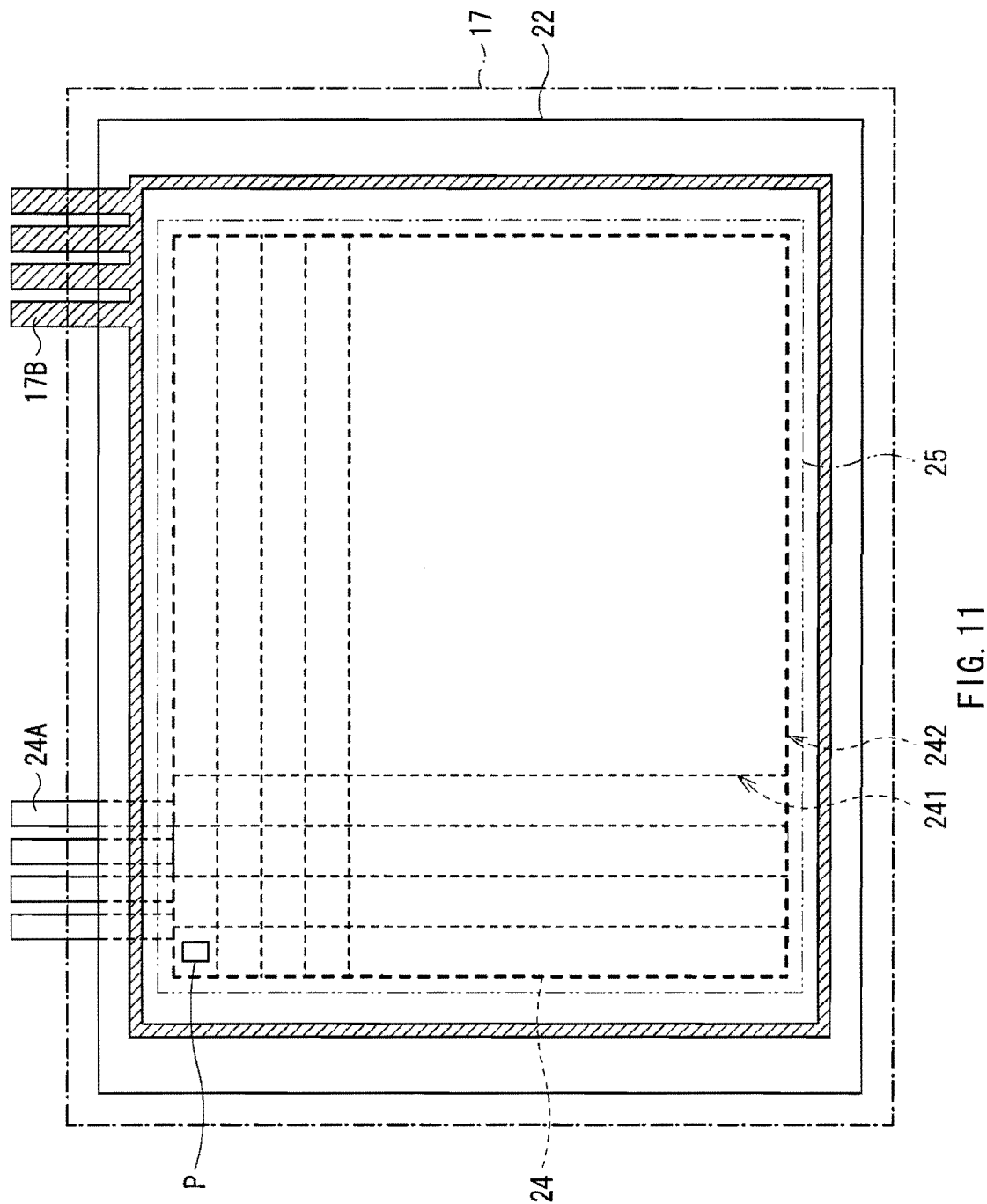
FIG. 11 is a diagram illustrating a plane configuration of an auxiliary wiring, a reverse bias wiring, and the like illustrated in FIG. 10.

The auxiliary wiring 24 is provided to suppress voltage drop in the second electrode 25, is electrically insulated from the first electrode 13 and, on the other hand, provided so as to be conducted with the second electrode 25. On the planarization layer 22, in a region outside of the formation region of the auxiliary wiring 24, in a manner similar to the foregoing embodiment, the reverse bias wiring 17B (not illustrated in FIG. 10) is disposed apart from the auxiliary wiring 24 and is connected to the reverse bias electrode 17. Referring now to FIG. 11, the detailed configuration of the auxiliary wiring 24, the reverse bias electrode 17, and the reverse bias wiring 17B will be described. FIG. 11 schematically illustrates the plane configuration of the auxiliary wiring 24 and the reverse bias wiring 17B and the formation region of the reverse bias electrode 17 and the second electrode 25.

The auxiliary wiring 24 is disposed in an inter-pixel region 241 between the pixels P below the planarization layer 22 and in a peripheral region 242 surrounding a display region formed by all of the pixels P. That is, like the auxiliary wiring 14 of the foregoing embodiment, the plane shape of the auxiliary wiring 24 is a shape obtained by partitioning the inside of the rectangular frame in a lattice shape in the substrate face. Above the planarization layer 22, the reverse bias wiring 17B is disposed so as to surround the peripheral region 242 of the auxiliary wiring 24 from the outside and so as to be apart from the auxiliary wiring 24.

The reverse bias wiring 17B may be made of a material similar to that of the first electrode 13 and, preferably, made of the same material as that of the first electrode 13, so that the first electrode 13 and the reverse bias wiring 17B are allowed to be patterned in the same process in a manufacturing process.

Over the planarization layer 22, the organic layer 16 (not illustrated in FIG. 11) is formed in the entire display region. Over the planarization layer 22, the organic layer 16 is provided on the outside of the peripheral region 242 of the auxiliary wiring 24 and on the inside of the formation region of the reverse bias wiring 17B. That is, the auxiliary wiring 24 is covered with the organic layer 16 and, on the other hand, the reverse bias wiring 17B is exposed from the organic layer 16.

In a manner similar to the foregoing embodiment, the reverse bias electrode 17 is disposed on the entire face of the planarization layer 22 (for example, the region surrounded by an alternate long and short dash line in FIG. 11). Over the reverse bias electrode 17, the second electrode 25 is provided from the display region to the region on the outside of the peripheral region 242 of the auxiliary wiring 24 and the inside of the formation region of the reverse bias wiring 17B (for example, the region surrounded by an alternate long and two short dashes line in FIG. 11).

To the auxiliary wiring 24 and the reverse bias wiring 17B, voltage application pads (first and second pads 24A and 17A) are attached, respectively. The first and second pads 24A and 17A are provided to apply reverse bias voltage to the organic layer 16 via the auxiliary wiring 24 and the reverse bias wiring 17B (reverse bias electrode 17), respectively, in the manufacturing process.

In the modification, the auxiliary wiring 24 and the reverse bias wiring 17B are provided in different layers, that is, partitioned by the planarization layer 22, so that the auxiliary wiring 24 and the first pad 24A are disposed so as not to be in direct contact with both of the reverse bias electrode 17 and the reverse bias wiring 17B. On the other hand, over the planarization layer 22, the reverse bias wiring 17B and the second pad 17A disposed so as to be exposed from the organic layer 16 are in direct contact with the reverse bias electrode 17 at least in a part.

The organic EL display 2 having the configuration as described above may be manufactured, for example, in a manner similar to the organic EL display 1 of the foregoing embodiment. The TFTs 11 are formed by patterning on the drive-side substrate 10 by, for example, sputtering and lithography. Subsequently, the planarization layer 22 is formed by using the above-described insulating material and, after that, the contact holes 22a and 22b are formed in a region above the wiring 21 and a region over the auxiliary wiring 24. Over the planarization 22, the first electrode 13 is formed by patterning so as to bury the contact hole 22a, and the inter-pixel insulating film 15 having an opening is formed in each of the regions corresponding to the first electrode 13 and the auxiliary wiring 24. On the inter-pixel insulating film 15, the organic layer 16 and the reverse bias electrode 17 are formed in order.

The auxiliary wiring 24 and the first pad 24A, and the reverse bias electrode 17 and the reverse bias wiring 17B are electrically insulated from each other with the organic layer 16 therebetween by the interposition of the planarization layer 22, so that potentials are applied independently from each other. Therefore, as described above, by contacting the first and second pads 24A and 17A with a probe, the reverse bias voltage is applied to the organic layer 16 via the auxiliary wiring 24 and the reverse bias wiring 17B. In such a manner, by removing the organic layer 16 formed over the auxiliary wiring 24, the contact holes 26A are formed. After that, by burying the contact holes 26A with the second electrodes 25 over the reverse bias electrode 17, electric connection between the auxiliary wiring 24 and the second electrode 25 is assured. Subsequently, the protection film 30 is formed over the second electrode 25 and, after that, in a manner similar to the foregoing embodiment, the organic EL display 2 illustrated in FIG. 10 is completed.

As in the modification, the auxiliary wiring 24 and the reverse bias wiring 17B may be disposed in layers different from each other. That is, as long as the auxiliary wiring 24 and the reverse bias wiring 17B are electrically insulated from each other and independent potentials are applicable, the auxiliary wiring 24 and the reverse bias wiring 17B may be provided in the same layer or different layers. With such a configuration, the reverse bias voltage is applicable across the auxiliary wiring 24 and the reverse bias wiring 17B and, as a result, the organic layer 16 over the auxiliary wiring 24 is selectively removable.

In the modification, the auxiliary wiring 24 is provided over the interlayer insulating film 11A and the reverse bias wiring 17B is provided over the planarization layer 22, so that they are insulated from each other by the planarization layer 22. Therefore, unlike the foregoing embodiment, it is unnecessary to lead a part of the planarization layer so as to cover the first pad.

Application Examples And Modules

Hereinbelow, modules and application examples of the organic EL displays 1 and 2 explained in the foregoing embodiment will be described. The organic EL displays 1 and 2 is applicable to electronic devices in all of fields for displaying a video signal entered from the outside or generated internally as an image or a video image, such as a television apparatus, a digital still camera, a notebook-sized personal computer, a portable terminal device such as a cellular phone, and a video camera.

Modules

Figure 12:
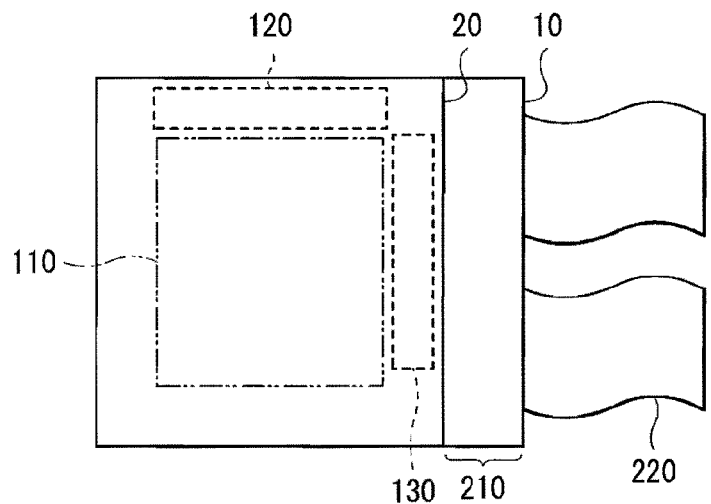
FIG. 12 is a plan view illustrating a schematic configuration of modules including the organic EL display of the embodiment.

The organic EL displays 1 and 2 are assembled, for example, as a module illustrated in FIG. 12, in various electronic devices in application examples 1 to 5 and the like which will be described later. The module has, at one side of the drive-side substrate 10, a region 210 exposed from the sealing-side substrate 20. To the region 210, wirings of a signal line drive circuit 120 and a scan line drive circuit 130 which will be described later are extended and external connection terminals (not illustrated) are formed. The external connection terminal may be provided with a flexible printed circuit (FPC) 220 for inputting/outputting signals.

Figure 13:
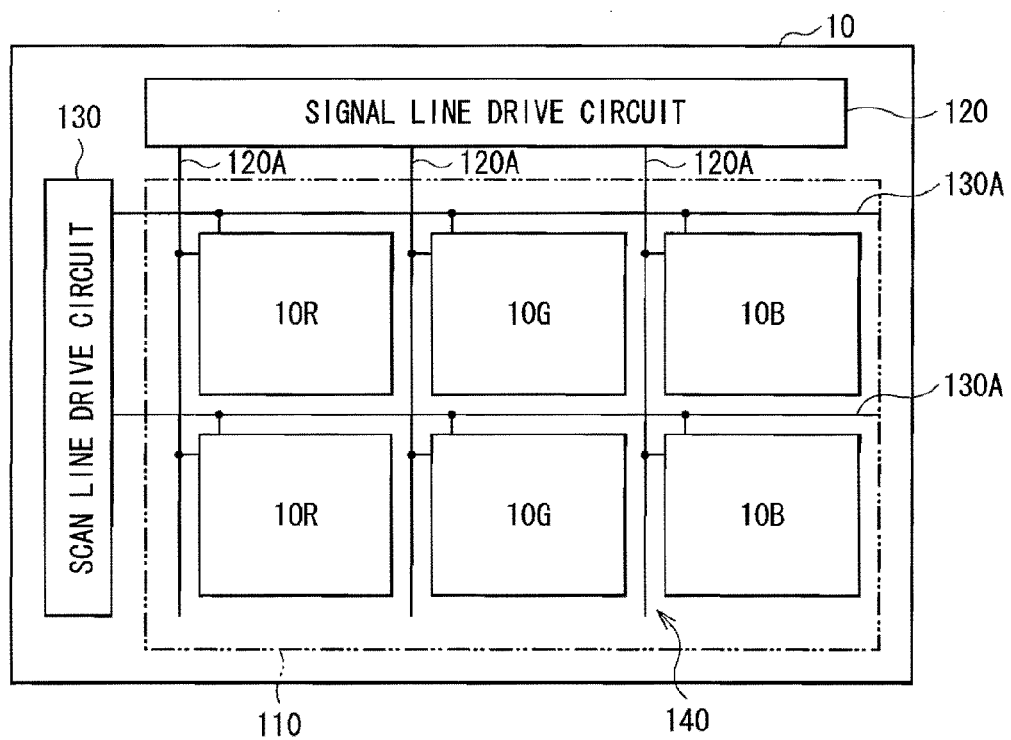
FIG. 13 is a plan view illustrating the configuration of drive circuits of the organic EL display in the modules illustrated in FIG. 12.

In the drive-side substrate 10, for example, as illustrated in FIG. 13, a display region 110 and the signal line drive circuit 120 and the scan line drive circuit 130 as drivers for displaying video images are formed. In the display region 110, a pixel drive circuit 140 is formed. In the display region 110, the organic EL elements 10R, 10G, and 10B are disposed in a matrix as a whole.

Figure 14:
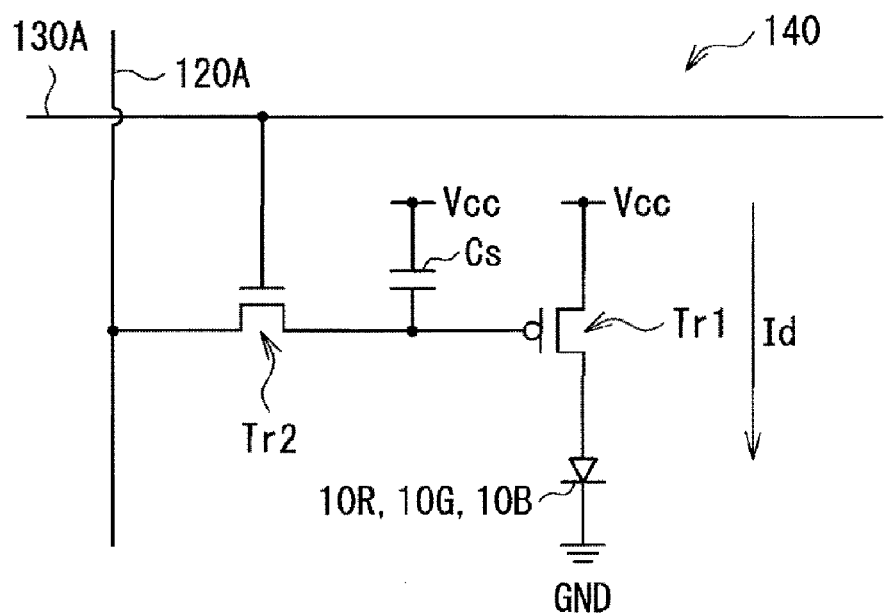
FIG. 14 is an equivalent circuit diagram illustrating an example of a pixel drive circuit illustrated in FIG. 13.

The pixel drive circuit 140 is, as illustrated in FIG. 14, an active-type drive circuit having a drive transistor Tr1 and a write transistor Tr2 formed in a layer below the first electrode 13, a capacitor (retentive capacitor) Cs between the transistors Tr1 and Tr2, and the organic EL element 10R (or 10G or 10B) connected in series with the drive transistor Tr1 between a first power line (Vcc) and a second power line (GND). The drive transistor Tr1 and the write transistor Tr2 are common thin film transistors (TFTs). The configuration may be, for example, an inversely-staggered structure (so-called bottom-gate type) or a staggered structure (top-gate type) and is not limited.

In the pixel drive circuit 140, a plurality of signal lines 120A are disposed in the column direction, and a plurality of scan lines 130A are disposed in the row direction. The intersecting point between the signal line 120A and the scan line 130A corresponds to one (sub pixel) of the organic EL elements 10R, 10G, and 10B. Each signal line 120A is connected to the signal line drive circuit 120, and an image signal is supplied from the signal line drive circuit 120 via the signal line 120A to the source electrode of the write transistor Tr2. Each scan line 130A is connected to the scan line drive circuit 130, and a scan signal is sequentially supplied from the scan line drive circuit 130 to the gate electrode of the write transistor Tr2 via the scan line 130A.

Application Example 1

Figure 15:
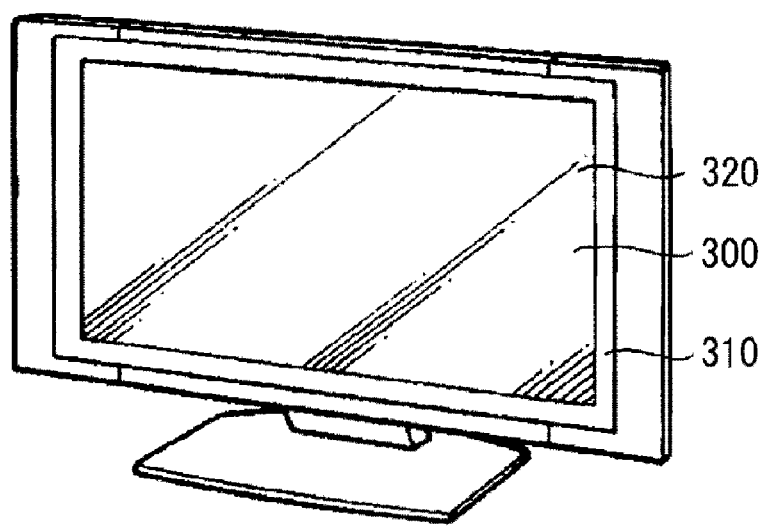
FIG. 15 is a perspective view illustrating the appearance of application example 1 of the display device of the embodiment.

FIG. 15 illustrates the appearance of a television apparatus to which the organic EL displays 1 and 2 of the foregoing embodiment are applied. The television apparatus has, for example, a video image display screen 300 including a front panel 310 and a filter glass 320.

Application Example 2

Figure 16A:
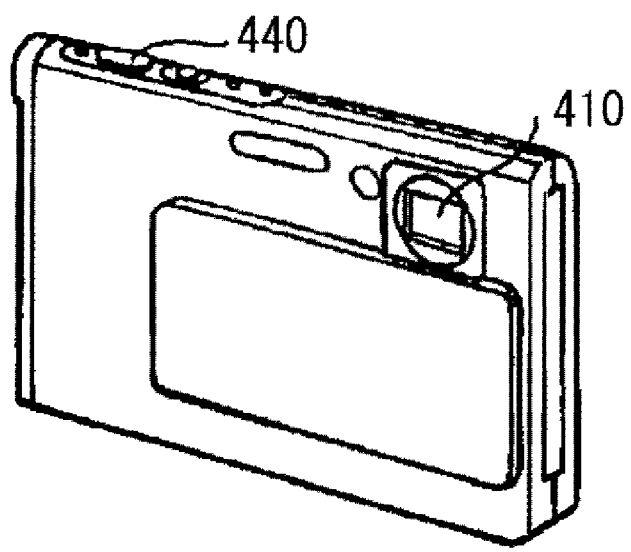
FIGS. 16A and 16B are perspective views illustrating the appearance of application example 2 of the display device of the embodiment.
Figure 16B:
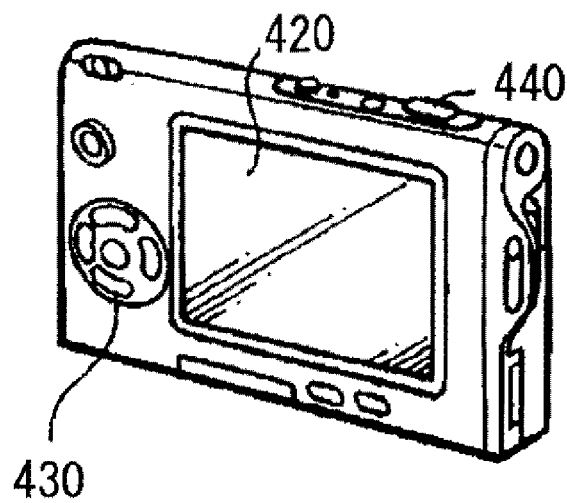

FIGS. 16A and 16B illustrate the appearance of a digital still camera to which the organic EL displays 1 and 2 of the embodiment are applied. The digital still camera has, for example, a light emission unit 410 for flash, a display unit 420, a menu switch 430, and a shutter button 440.

Application Example 3

Figure 17:
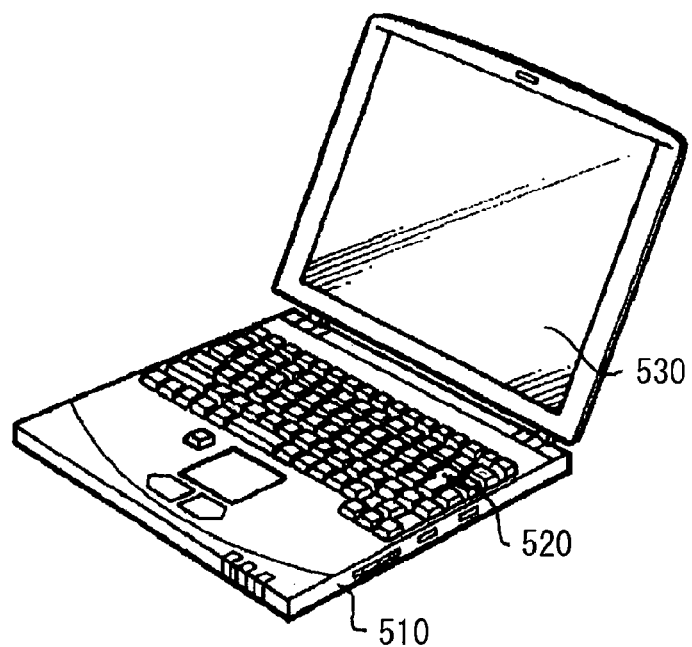
FIG. 17 is a perspective view illustrating the appearance of application example 3 of the display device of the embodiment.

FIG. 17 illustrates the appearance of a notebook-sized personal computer to which the organic EL displays 1 and 2 of the embodiment are applied. The notebook-sized personal computer has, for example, a body 510, a keyboard 520 for operation of entering characters and the like, and a display unit 530 for displaying an image.

Application Example 4

Figure 18:
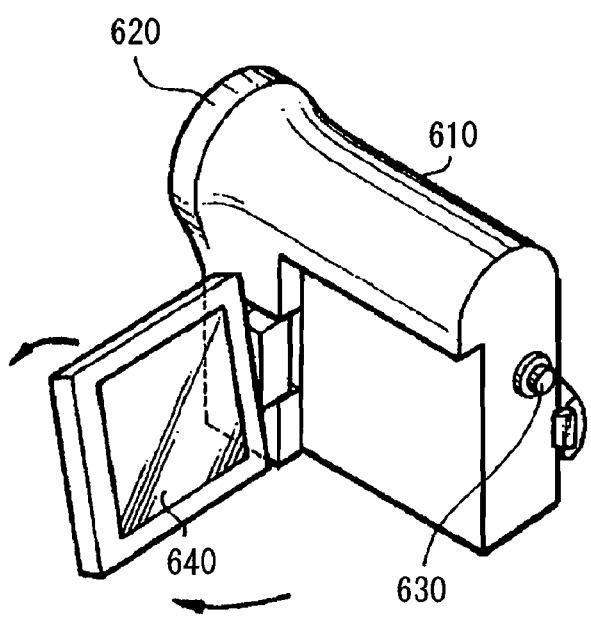
FIG. 18 is a perspective view illustrating the appearance of application example 4 of the display device of the embodiment.

FIG. 18 illustrates the appearance of a video camera to which the organic EL displays 1 and 2 of the embodiment are applied. The video camera has, for example, a body 610, a lens 620 for shooting a subject, provided on the front side face of the body 610, a shooting start-stop switch 630, and a display unit 640.

Application Example 5

FIGS. 19A to 19G illustrate the appearance of a cellular phone to which the organic EL displays 1 and 2 of the embodiment are applied. The cellular phone is obtained by coupling an upper-side casing 710 and a lower-side casing 720 via a coupling unit (hinge) 730 and has a display 740, a sub-display 750, a picture light 760, and a camera 770.

The present invention has been described above by the embodiment and the modification. However, the invention is not limited to the embodiment and the like but may be variously modified. For example, in the embodiment and the like, the configuration in which the reverse bias wiring 17B is disposed so as to surround the formation region of the auxiliary wiring has been described. However, the plane configuration of the reverse bias wiring 17B is not limited to the above. For example, the reverse bias wiring 17B may be provided so as to face at least one of four sides of the rectangular auxiliary wiring in the substrate plane. That is, the reverse bias wiring 17B may be formed apart from the auxiliary wiring in at least a part of the periphery of the auxiliary wiring.

In the case of forming the auxiliary wiring 14 and the reverse bias wiring 17B over the planarization layer 12 in the embodiment, the first pad 14A is covered with a part of the planarization layer 12 (covering part 12A). The first pad 14A may be covered by using an insulating material different from that of the planarization layer 12. For example, at the time of forming the inter-pixel insulating film 15 formed on the first electrode 13 and the auxiliary wiring 14, the inter-pixel insulating film 15 may be extended to a position where the first pad 14A is covered. Alternatively, the covering part 12A may be made of an insulating material different from both of that of the planarization layer 12 and that of the inter-pixel insulating film 15.

Further, in the embodiment and the like, the configuration in which the reverse bias electrode 17 is provided between the organic layer 16 and the second electrode and is connected to the reverse bias wiring 17B has been described as an example. However, the reverse bias electrode 17 may not be disposed. That is, a configuration in which the auxiliary wiring and the reverse bias wiring 17B are electrically insulated from each other and reverse bias voltage is applied to the organic layer 16 is sufficient.

The invention is not limited to the materials and thicknesses of the layers, the film forming methods, film forming conditions, and the like described in the embodiment and the like, but other materials and thicknesses, other film forming methods, and other film forming conditions may be used.

In addition, in the embodiment and the like, the case where the light emission layer of the organic layer 16 includes three layers of the red light emission layer, the green light emission layer, and the blue light emission layer has been described. The configuration of the light emission layer for emitting white light is not limited to the case. The light emission layer for emitting white light may have a structure of stacking light emission layers of two colors having a complementary relation, such as an orange light emission layer and a blue light emission layer, or a blue-green light emission layer and a red light emission layer. In the foregoing embodiment, the configuration in which the layers of three colors are stacked in the thickness direction has been described as an example. It is also possible to paint color light emission layers pixel by pixel in correspondence with the pixels of R, G, and B.

In the embodiment and the like, the case where the first electrode 13 is an anode and the second electrodes 18 and 25 are cathodes has been described. The first electrode 13 may be set as a cathode, and the second electrode 18 may be set as an anode. In this case, as the material of the second electrode 18, a single material or an alloy of gold, silver, platinum, copper, or the like is preferable.

The present application contains subject matter related to that disclosed in Japanese Priority Patent Application JP 2008-278233 filed in the Japanese Patent Office on Oct. 29, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An organic EL display comprising:
   a plurality of pixels each having, in order from a substrate side, a first electrode, an organic layer including a light emission layer, and a second electrode;
   an auxiliary wiring disposed in a periphery region of each of the plurality of pixels and conducted to the second electrode; and
   another auxiliary wiring disposed apart from the auxiliary wiring at least in a part of outer periphery of a formation region of the auxiliary wiring in a substrate surface.

2. The organic EL display according to claim 1, wherein the plurality of pixels are disposed in matrix on the substrate, and
   the auxiliary wiring is disposed in an inter-pixel region between the plurality of pixels and a peripheral region surrounding the entire plural pixels.

3. The organic EL display according to claim 2, wherein the another auxiliary wiring is disposed so as to surround the peripheral region of the auxiliary wiring.

4. The organic EL display according to claim 1, further comprising a third electrode disposed between the organic layer and the second electrode so as to cover a formation region of the another auxiliary wiring.

5. The organic EL display according to claim 1, further comprising, on the substrate, a drive circuit for driving the plurality of pixels and a planarization layer for planarizing the drive circuit and made of an insulating material,
   wherein the auxiliary wiring and the another auxiliary wiring are disposed over the planarization layer together with the first electrode.

6. The organic EL display according to claim 1, further comprising, on the substrate, a drive circuit for driving the plurality of pixels and a planarization layer for planarizing the drive circuit and made of an insulating material,
   wherein the auxiliary wiring is disposed over the substrate together with the drive circuit and covered with the planarization layer, and
   the another auxiliary wiring is disposed over the planarization layer together with the first electrode.

* * * * *